(12) United States Patent
Endou et al.

(10) Patent No.: US 10,938,325 B2
(45) Date of Patent: Mar. 2, 2021

(54) PIEZOELECTRIC ACTUATOR DRIVE CIRCUIT

(71) Applicants:NEW JAPAN RADIO CO., LTD., Tokyo (JP); MURATA MANUFACTURING CO., LTD., Nagaokakyo (JP)

(72) Inventors: Yasuyuki Endou, Fujimino (JP); Toshio Imanishi, Nagaokakyo (JP); Hitoshi Matsuno, Nagaokakyo (JP)

(73) Assignees: NEW JAPAN RADIO CO., LTD., Tokyo (JP); MURATA MANUFACTURING CO., LTD., Nagaokakyo (JP)

( * ) Notice: Subject to any disclaimer, the term of this patent is extended or adjusted under 35 U.S.C. 154(b) by 496 days.

(21) Appl. No.: 15/770,149

(22) PCT Filed: Oct. 18, 2016

(86) PCT No.: PCT/JP2016/080864
§ 371 (c)(1),
(2) Date: Apr. 20, 2018

(87) PCT Pub. No.: WO2017/069123
PCT Pub. Date: Apr. 27, 2017

(65) Prior Publication Data
US 2018/0309391 A1    Oct. 25, 2018

(30) Foreign Application Priority Data

Oct. 22, 2015 (JP) .............................. JP2015-207677

(51) Int. Cl.
*H01L 41/04* (2006.01)
*H02N 2/00* (2006.01)
(Continued)

(52) U.S. Cl.
CPC ........... *H02N 2/008* (2013.01); *B06B 1/0246* (2013.01); *B06B 1/0269* (2013.01);
(Continued)

(58) Field of Classification Search
CPC .............................. H02N 2/008; H01L 41/042
(Continued)

(56) References Cited

U.S. PATENT DOCUMENTS

| 2004/0046484 A1* | 3/2004 | Schiller ................. H01L 41/042 310/317 |
| 2011/0068657 A1* | 3/2011 | Sunaga ................. H01L 41/042 310/316.01 |

(Continued)

FOREIGN PATENT DOCUMENTS

JP          2011-083767 A        4/2011

OTHER PUBLICATIONS

International Search Report for related PCT Application No. PCT/JP2016/080864 dated Dec. 6, 2016; 3 pages; English translation provided.

*Primary Examiner* — Derek J Rosenau
(74) *Attorney, Agent, or Firm* — Procopio, Cory, Hargreaves & Savitch LLP (57) ABSTRACT

A self-oscillating piezoelectric actuator drive circuit includes a integrating circuit; an inverter (INV1), inverters (INV2 and INV3) inverting an output signal of the inverter (INV1), sense resistors (Rs1 and Rs2) connected to output sides of the inverters (INV2 and INV3), a positive feedback resistor (Rfb2) feeding back an output signal of the inverters (INV2 and INV3) to the integrating circuit; and a negative feedback resistor (Rfb1) feeding back a voltage generated from the sense resistors (Rs1 and Rs2, Rs1<Rs2 in terms of a resistance value) to the integrating circuit. In a startup state, the sense resistor (Rs2) and the inverter (INV3) are (Continued)

selected, and in an operating state after the startup state, the sense resistor (Rs1) and the inverter (INV2) are selected.

5 Claims, 10 Drawing Sheets

(51) Int. Cl.
  *B06B 1/02* (2006.01)
  *H03B 5/36* (2006.01)
  *B06B 1/06* (2006.01)
  *H01L 41/09* (2006.01)
(52) U.S. Cl.
  CPC ............ *B06B 1/0644* (2013.01); *H03B 5/36* (2013.01); *B06B 2201/55* (2013.01); *H01L 41/042* (2013.01); *H01L 41/09* (2013.01)
(58) Field of Classification Search
  USPC .................................................. 310/317, 318
  See application file for complete search history.

(56) References Cited

U.S. PATENT DOCUMENTS

2011/0068658 A1\* 3/2011 Kamitani ................ F04D 27/00
                                                            310/316.01
2012/0293041 A1   11/2012 Kamitani et al.

\* cited by examiner

PIEZOELECTRIC ACTUATOR DRIVE CIRCUIT

TECHNICAL FIELD

The present invention relates to a self-oscillating piezoelectric actuator drive circuit.

BACKGROUND ART

An oscillating body using a piezoelectric actuator can realize lower power consumption and smaller size as compared to a motor-controlled oscillating body, and is a useful technique that is expected to be applied to mobile devices in the future.

Figure 11:
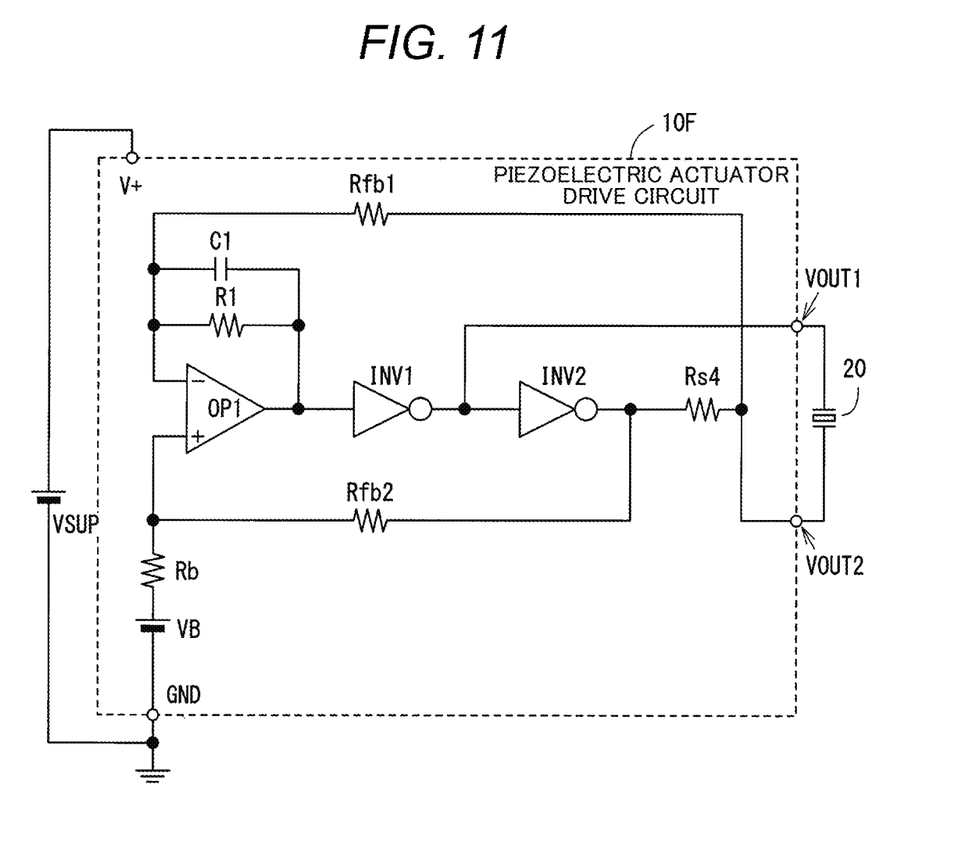
FIG. 11 is a circuit diagram illustrating a piezoelectric actuator drive circuit of the related art.

FIG. 11 illustrates a self-oscillating piezoelectric actuator drive circuit 10F of the related art that drives an oscillating body. A piezoelectric actuator 20 has a predetermined capacity and several resonant frequencies, and self-oscillates at a primary resonant frequency among the frequencies.

The piezoelectric actuator drive circuit 10F that drives the piezoelectric actuator 20 includes: an integrating circuit that includes an operational amplifier OP1, a resistor R1, and a capacitor C1; a negative feedback loop that passes through a negative feedback resistor Rfb1; and a positive feedback loop that passes through a positive feedback resistor Rfb2. In order to prevent the circuit from operating when a value of a sense resistor Rs4 is 0Ω, constants are set such that R1=Rb and Rfb1=Rfb2.

When the value of the sense resistor Rs4 satisfies Rs4>0, a resonant voltage is generated at both terminals of the sense resistor Rs4 due to a time constant and a resonant current derived from the value of the sense resistor Rs4 and the capacity of the piezoelectric actuator 20, and frequency characteristics of a loop gain of a feedback signal change. This loop gain is in inverse proportion to a cut-off frequency of an LPF derived from the value of the sense resistor Rs4 and the capacity of the piezoelectric actuator 20.

Figure 2:
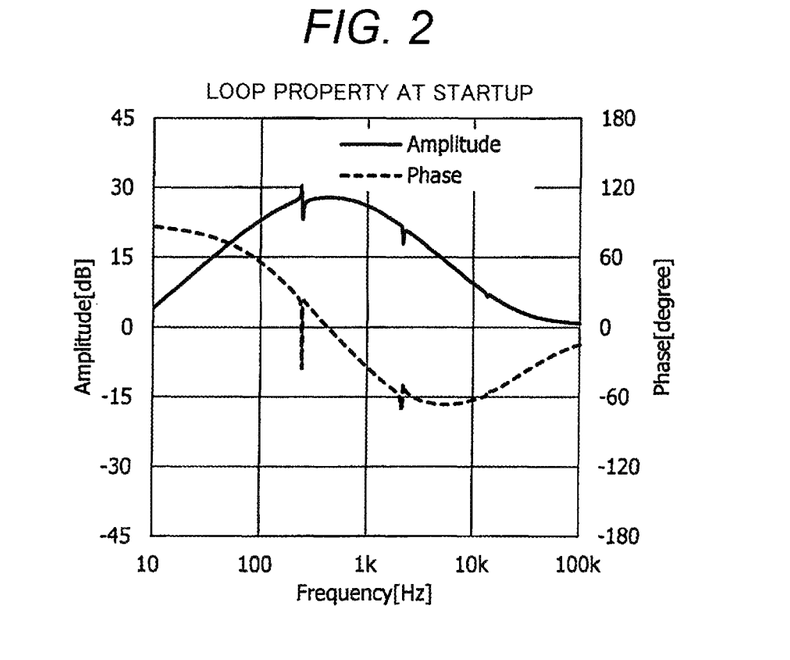
FIG. 2 is a characteristic diagram illustrating loop characteristics of the piezoelectric actuator drive circuit at startup.

As illustrated in FIG. 2, the phase largely changes at a resonant frequency at startup. Therefore, in a case where the loop gain is 0 dB or higher and the phase is 0 degree, oscillation occurs at a resonant frequency in the principle of oscillation. At this time, the principle of oscillation is also satisfied at a secondary or higher-order resonant frequency. Therefore, oscillation may occur at the higher-order resonant frequency. In particular, since a primary resonant current at startup is low, an effect of a higher-order resonant current is likely to increase, and oscillation easily occurs at an undesired frequency.

Therefore, in order not to be influenced by the higher-order resonant frequency, the effect of the higher-order resonant frequency is reduced using the integrator including the operational amplifier OP1, the resistor R1, and the capacitor C1 such that oscillation occurs at a primary resonant frequency. For example, Patent Literature 1 discloses a technique of suppressing oscillation at a higher-order resonant frequency.

PRIOR ART DOCUMENTS

Patent Documents

[Patent Document 1] JP-A 2011-083767

SUMMARY OF THE INVENTION

Technical Problem

Incidentally, as the current at a primary resonant frequency increases, the piezoelectric actuator 20 can oscillate an oscillating body more strongly. Therefore, as the value of the sense resistor Rs4 connected in series to the piezoelectric actuator 20 decreases, the resonant current increases, which is preferable. However, as the value of the sense resistor Rs4 decreases, the loop gain at about a primary resonant frequency decreases. Therefore, the effect of a higher-order resonant frequency component increases, and oscillation is likely to occur at the higher-order frequency component different from a desired frequency. That is, a trade-off relationship is established.

In the piezoelectric actuator 20, characteristics at about a resonant frequency are likely to change depending on an installation environment, and thus it is important to reduce an effect of a higher-order resonant frequency. Therefore, in the related art, in order to cause oscillation to occur at a primary resonant frequency, it is necessary to sacrifice the oscillation intensity.

An object of the present invention is to eliminate a trade-off relationship between stable oscillation of a piezoelectric actuator drive circuit at a primary resonant frequency and an increase in the oscillation amount of a piezoelectric actuator by adding a small number of circuits.

Solution to Problem

In order to achieve the object, according to the present invention, there is provided a self-oscillating piezoelectric actuator drive circuit including: an integrating circuit integrating a signal obtained in which a negative feedback signal is subtracted from a positive feedback signal; a first inverter inverting an output signal of the integrating circuit; a second inverter inverting an output signal of the first inverter; a sense resistor connected to an output side of the second inverter; a positive feedback resistor feeding back an output signal of the second inverter as the positive feedback signal; a negative feedback resistor feeding back a voltage generated from the sense resistor as the negative feedback signal; and a switching device switching frequency characteristics of the positive feedback signal and the negative feedback signal, a piezoelectric actuator is connected between a common connection point of the first inverter and the second inverter and a common connection point of the sense resistor and the negative feedback resistor, and the switching device switches the frequency characteristics of the positive feedback signal and the negative feedback signal between a startup state and in an operating state after the startup state.

In the piezoelectric actuator drive circuit according to the invention, the sense resistor includes at least a first resistor and a second resistor having a higher resistance value than a resistance value of the first resistor, and the switching device switches to the second resistor in the startup state and switches to the first resistor in the operating state.

In the piezoelectric actuator drive circuit according to the invention, the integrating circuit includes a feedback resistor, and the switching device switches a resistance value of the feedback resistor.

In the piezoelectric actuator drive circuit according to the invention, switching from the startup state to the operating state is performed when a pulse number of an output voltage of the first inverter reaches a predetermined number.

In the piezoelectric actuator drive circuit according to the invention, switching from the startup state to the operating state is performed when a value of a resonant current flowing through the sense resistor reaches a predetermined value.

Advantageous Effects of the Invention

According to the present invention, a trade-off relationship between stable oscillation of the piezoelectric actuator drive circuit at a primary resonant frequency and an increase in the oscillation amount of the piezoelectric actuator can be eliminated by adding a small number of circuits, and an increase in costs during integration can be suppressed.

DESCRIPTION OF EMBODIMENTS

First Embodiment

Figure 1:
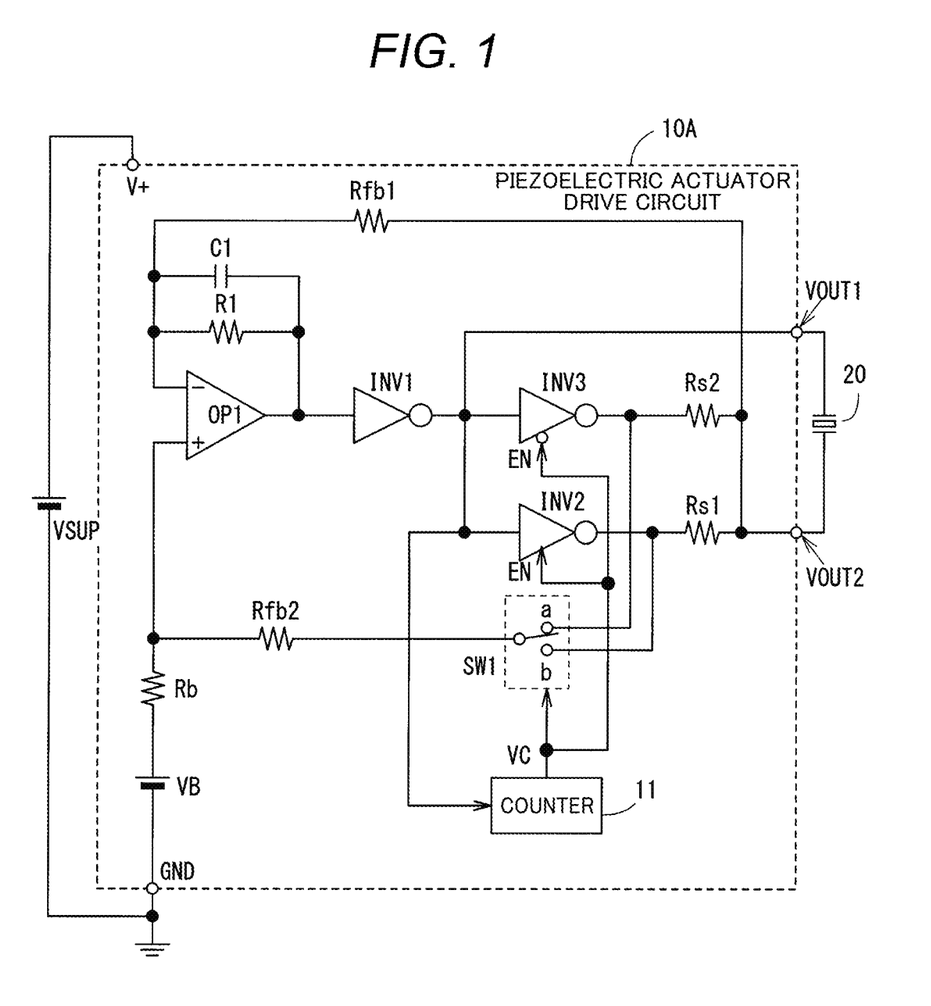
FIG. 1 is a circuit diagram illustrating a piezoelectric actuator drive circuit according to a first embodiment of the present invention.

FIG. 1 illustrates a self-oscillating piezoelectric actuator drive circuit 10A according to a first embodiment. The piezoelectric actuator drive circuit 10A includes an operational amplifier OP1, in which a resistor R1 and a capacitor C1 are connected in parallel between an output terminal and an inverting input terminal (−) of the operational amplifier OP1. An inverter INV1 is connected to the output terminal of the operational amplifier OP1, and an inverter INV2 and an inverter INV3 are connected in parallel to an output terminal of the inverter INV1. One-side terminals of sense resistors Rs1 and Rs2 are connected to an output terminal of the inverter INV2 and an output terminal of the inverter INV3, respectively. A negative feedback resistor Rfb1 is connected between the other terminals of the sense resistors Rs1 and Rs2 and the inverting input terminal of the operational amplifier OP1. A positive feedback resistor Rfb2 is connected between the output terminal of the inverter INV2 or the output terminal of the inverter INV3 and a non-inverting input terminal (+) of the operational amplifier OP1. In addition, the piezoelectric actuator drive circuit 10A includes a counter 11 and a switch SW1 that switch a connection state between the inverter INV2 and the inverter INV3.

In the piezoelectric actuator drive circuit 10A, the operational amplifier OP1, the resistor R1, and the capacitor C1 constitute an integrating circuit that integrates a signal obtained by subtracting a negative feedback signal from a positive feedback signal. The inverter INV1, the inverter INV2, the sense resistor Rs1, and the negative feedback resistor Rfb1, or the inverter INV1, the inverter INV3, the sense resistor Rs2, and the negative feedback resistor Rfb1 constitute a part of a negative feedback loop. The negative feedback resistor Rfb1 feeds back a voltage generated from the sense resistor Rs1 or the sense resistor Rs2 as the negative feedback signal. In addition, the inverter INV1, the inverter INV2, and the positive feedback resistor Rfb2, or the inverter INV1, the inverter INV3, and the positive feedback resistor Rfb2 constitute a part of a positive feedback loop. The positive feedback resistor Rfb2 feeds back an output signal of the inverter INV1 and the inverter INV2 or an output signal of the inverter INV1 and the inverter INV3 as the positive feedback signal. Resistance values of the sense resistors Rs1 and Rs2 have a relationship of Rs1<Rs2. Rb represents a bias resistance, VB represents a bias voltage, and VSUP represents a supply voltage. The bias voltage VB and the supply voltage VSUP have a relationship of VB=VSUP/2. The piezoelectric actuator 20 is connected between a common connection point of the inverters INV1, INV2, and INV3 and a common connection point of the sense resistors Rs1 and Rs2.

The inverter INV1 corresponds to an example of a first inverter that inverts an output signal of the integrating circuit, the inverters INV2 and INV3 correspond to an example of a second inverter that inverts an output signal of the first inverter, and the sense resistors Rs1 and Rs2 correspond to an example of a sense resistor that is connected to an output side of the second inverter.

The counter 11 is a circuit element that counts output pulses of a resonant voltage output from the inverter INV1. During a period until a count value of the counter 11 reaches CN1, a control signal VC that is an output of the counter 11 becomes "L" such that the switch SW1 is switched to a contact point a side, the inverter INV3 operates, and the inverter INV2 does not operate. After the count value of the counter 11 reaches CN1, the control signal VC becomes "H" such that the switch SW1 is switched to a contact point b side, the inverter INV3 does not operate, and the inverter INV2 operates. A timing at which the count value of the counter 11 reaches CN1 is preset so as to match with a timing at which the piezoelectric actuator drive circuit 10A is transitioned from a startup state to an operating state. The counter 11 corresponds to an example of a switching device that switches frequency characteristics of the positive feedback signal and the negative feedback signal.

When the piezoelectric actuator drive circuit 10A activates, in the startup state until the count value of the counter 11 reaches CN1, the control signal VC becomes "L" such that SW1 is switched to the contact point a side, the inverter INV3 operates, and the inverter INV2 does not operate. Therefore, the sense resistor Rs2 having a high resistance value is connected in series to the piezoelectric actuator 20. As a result, as illustrated in FIG. 2, the loop gain at about a primary resonant frequency increases, and oscillation reliably starts at about the primary resonant frequency. At this time, the pulses of the resonant voltage are counted by the counter 11.

Figure 3:
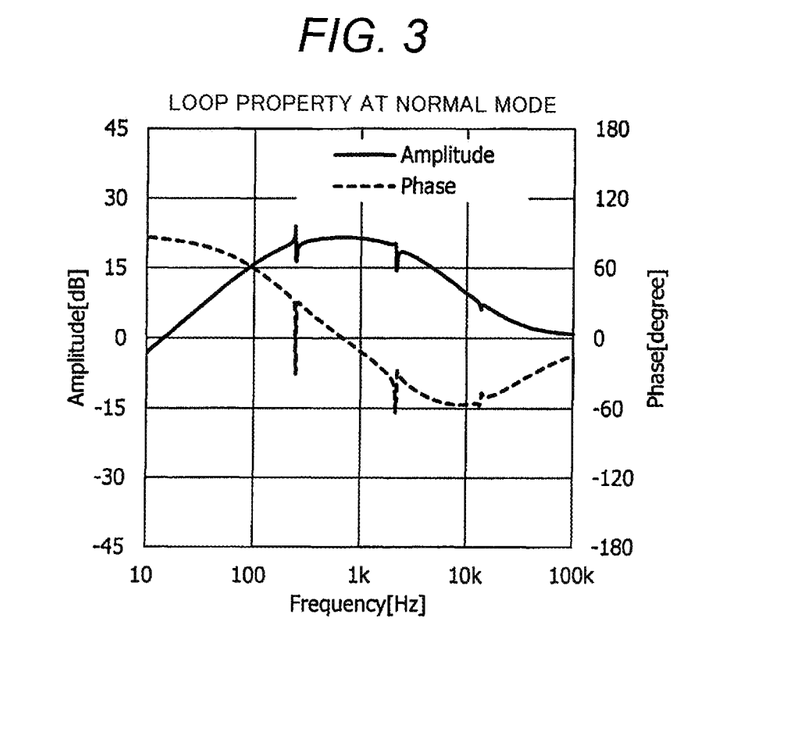
FIG. 3 is a characteristic diagram illustrating loop characteristics of the piezoelectric actuator drive circuit during a steady operation.

After the count value of the counter 11 reaches CN1, the control signal VC becomes "H" such that the switch SW1 is switched to the contact point b side, the inverter INV2 operates, the inverter INV3 does not operate, and the piezoelectric actuator drive circuit 10A is transitioned to the operating state. In this operating state, the sense resistor Rs1 having a low resistance value is connected to the negative feedback loop. As a result, as illustrated in FIG. 3, the loop gain slightly decreases, the resonant current increases, and the piezoelectric actuator 20 largely oscillates.

Figure 4:
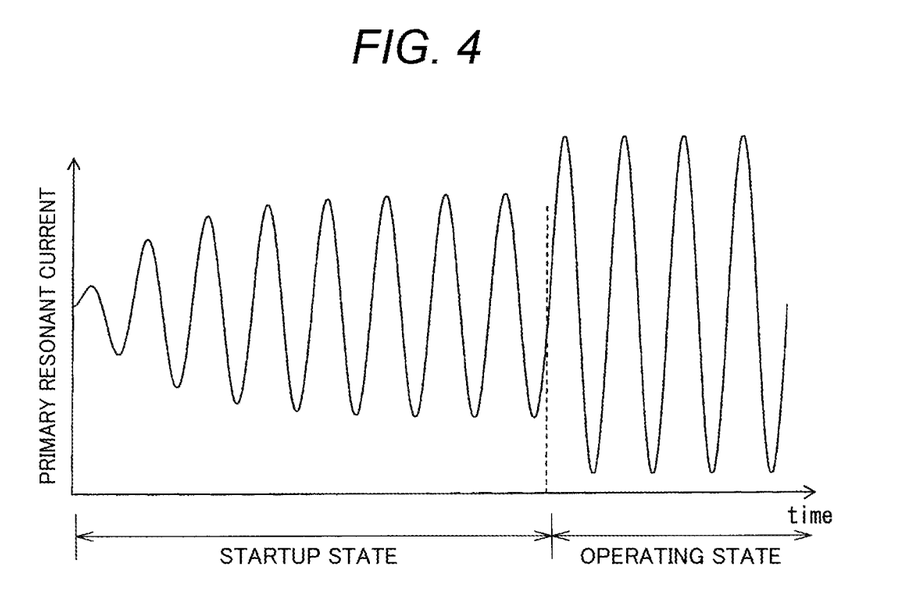
FIG. 4 is a waveform chart illustrating a primary resonant current of the piezoelectric actuator drive circuit illustrated in FIG. 1.

At this time, the area of a higher-order resonant frequency component increases, but the primary resonant current in the startup state sufficiently increases as illustrated in FIG. 4. Therefore, an effect of the higher-order resonant frequency component relatively decreases, oscillation is maintained as it is at about the primary resonant frequency. Accordingly, oscillation is maintained in a state where the primary resonant current is predominant, and the maximum value of the resonant current also increases.

This way, in the embodiment, a trade-off relationship between stable oscillation of the piezoelectric actuator drive circuit at a primary resonant frequency and an increase in the oscillation amount of the piezoelectric actuator 20 can be eliminated by adding a small number of circuits, and an increase in costs during integration can be suppressed.

Second Embodiment

Figure 5:
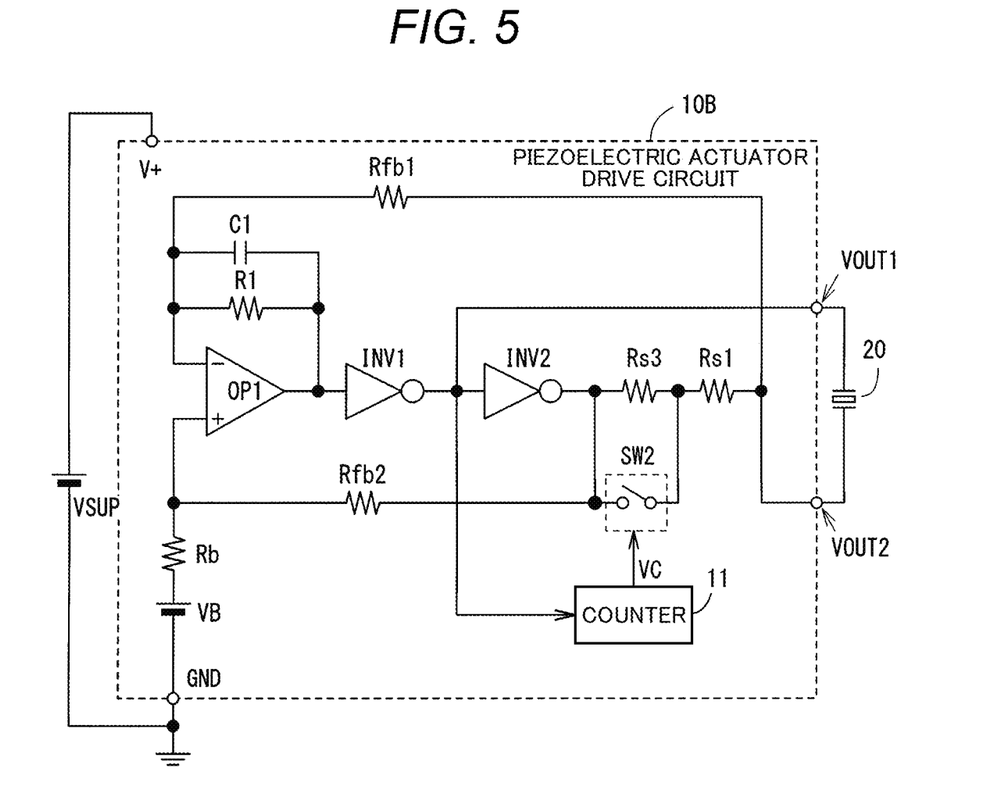
FIG. 5 is a circuit diagram illustrating a piezoelectric actuator drive circuit according to a second embodiment of the invention.

FIG. 5 illustrates a piezoelectric actuator drive circuit 10B according to a second embodiment. In this embodiment, another sense resistor Rs3 is inserted and connected between the inverter INV2 and the sense resistor Rs1, a switch SW2 is connected between both terminals of the sense resistor Rs3, and the switch SW2 is controlled to be on/off by the counter 11. Here, a resistance value of the sense resistor Rs3 is selected such that a relationship between the sense resistor Rs3 and the sense resistor Rs2 according to the first embodiment satisfies Rs1+Rs3=Rs2.

When the piezoelectric actuator drive circuit 10B activates, in the startup state until the count value of the counter 11 reaches CN1, the control signal VC becomes "L" and SW2 is switched off. Therefore, the total resistance value of the sense resistors satisfies "Rs1+Rs3", the resistance value of the sense resistor Rs1 further increases, the loop gain at about a primary resonant frequency increases, and oscillation reliably starts at about the primary resonant frequency. At this time, the pulses of the resonant voltage are counted by the counter 11.

After the count value of the counter 11 reaches CN1, the control signal VC becomes "H", the switch SW2 is switched on, the sense resistor Rs3 is short-circuited, and the piezoelectric actuator drive circuit 10B is transitioned to the operating state. In this operating state, the sense resistor Rs1 is connected to the negative feedback loop. Therefore, the resonant current increases, and the piezoelectric actuator 20 largely oscillates.

This way, in the second embodiment, as in the first embodiment, a trade-off relationship between stable oscillation of the piezoelectric actuator drive circuit at a primary resonant frequency and an increase in the oscillation amount of the piezoelectric actuator 20 can be eliminated by adding a small number of circuits. In addition, unlike the first embodiment, it is not necessary to increase the number of inverters. Therefore, an increase in costs during integration can be further suppressed.

Third Embodiment

Figure 6:
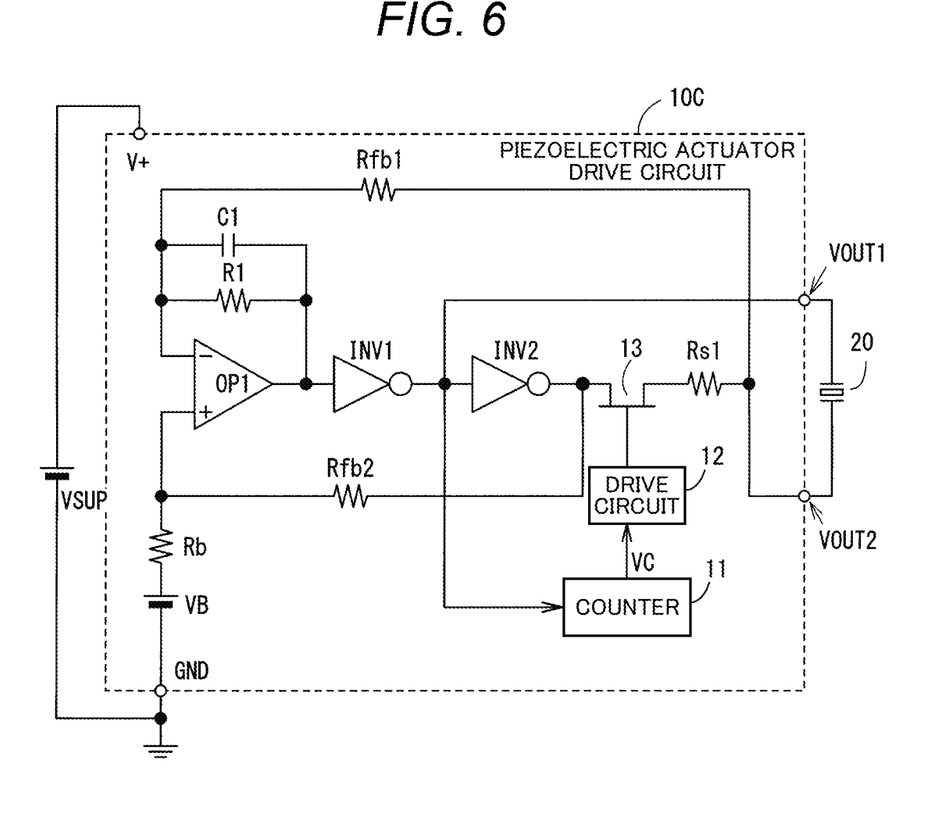
FIG. 6 is a circuit diagram illustrating a piezoelectric actuator drive circuit according to a third embodiment of the invention.

FIG. 6 illustrates a piezoelectric actuator drive circuit 10C according to a third embodiment. In this embodiment, a MOS transistor 13 is inserted and connected between the inverter INV2 and the sense resistor Rs1, and the MOS transistor 13 is controlled by a drive circuit 12 that is controlled by the control signal VC of the counter 11.

When the piezoelectric actuator drive circuit 10C activates, in the startup state until the count value of the counter 11 reaches CN1, the control signal VC becomes "L", and the drive circuit 12 sets an internal resistance of the MOS transistor 13 to be a predetermined resistance value (Rs3 of the second embodiment). Therefore, the sum of the resistance value of the MOS transistor 13 and the resistance value of the sense resistor Rs1 is higher than the resistance value of the sense resistor Rs1, the loop gain at about a primary resonant frequency increases, and oscillation reliably starts at about the primary resonant frequency. At this time, the pulses of the resonant voltage are counted by the counter 11.

After the count value of the counter 11 reaches CN1, the control signal VC becomes "H", the drive circuit 12 sets the internal resistance of the MOS transistor 13 to be substantially zero, and the piezoelectric actuator drive circuit 10C is transitioned to the operating state. In this operating state, there is no effect of the MOS transistor 13. Therefore, the resonant current increases, and the piezoelectric actuator 20 largely oscillates.

In the third embodiment, as in the first embodiment, a trade-off relationship between stable oscillation of the piezoelectric actuator drive circuit at a primary resonant frequency and an increase in the oscillation amount of the piezoelectric actuator 20 can be eliminated by adding a small number of circuits. In addition, unlike the first embodiment, it is not necessary to increase the number of inverters, a resistor and a switch can be realized by the MOS transistor 13, and thereby an increase in costs during integration can be further suppressed. Further, the internal resistance of the MOS transistor 13 can be smoothly switched by the drive circuit 12, and a rapid change of the sense resistor can be prevented.

Fourth Embodiment

Figure 7:
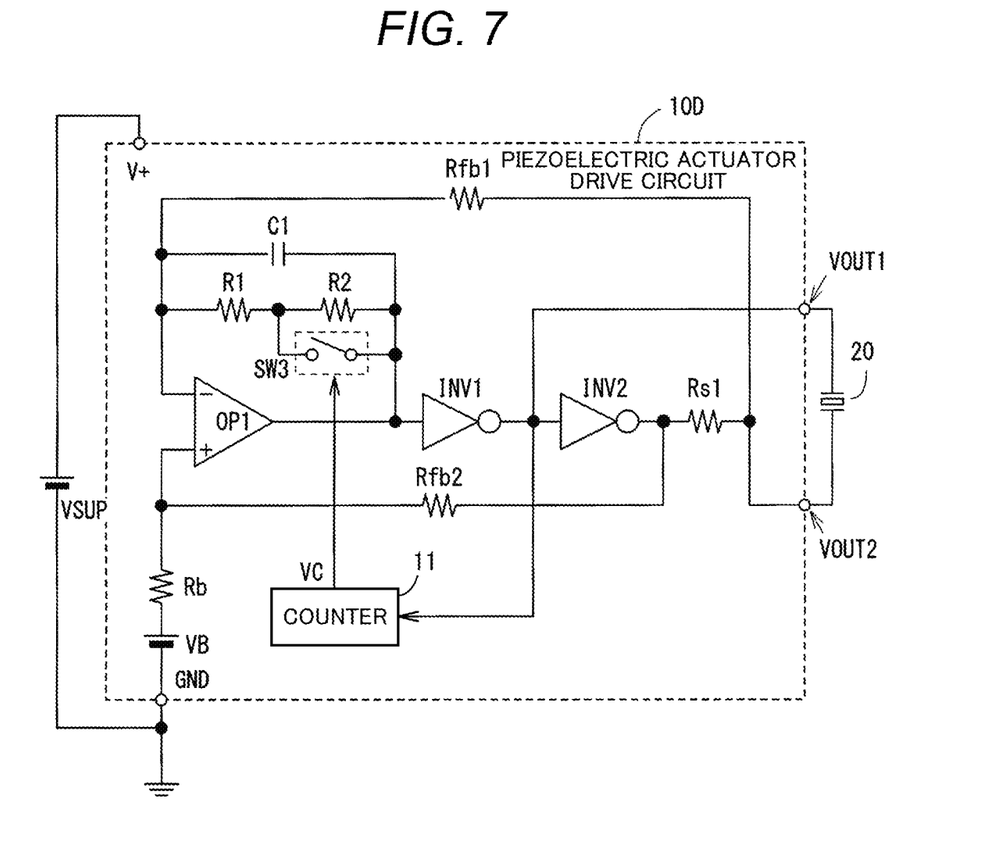
FIG. 7 is a circuit diagram illustrating a piezoelectric actuator drive circuit according to a fourth embodiment of the invention.

FIG. 7 illustrates a piezoelectric actuator drive circuit 10D according to a fourth embodiment. In this embodiment, another resistor R2 is connected in series to the resistor R1 of the integrating circuit, a switch SW3 is connected between both terminals of the resistor R2, and the switch SW3 is controlled to be on/off by the counter 11.

When the piezoelectric actuator drive circuit 10D activates, in the startup state until the count value of the counter 11 reaches CN1, the control signal VC becomes "L" and SW3 is switched off. Therefore, the resistors R1 and R2 are connected in series to the integrating circuit, the loop gain in a low frequency range including a primary resonant frequency increases, and oscillation reliably starts at about the primary resonant frequency. At this time, the pulses of the resonant voltage are counted by the counter 11.

After the count value of the counter 11 reaches CN1, the control signal VC becomes "H", the switch SW3 is switched on, the resistor R2 is short-circuited, and the piezoelectric actuator drive circuit 10D is transitioned to the operating state. In the operating state, the feedback resistor is only R1. Therefore, the loop gain is appropriately set, and the piezoelectric actuator 20 largely oscillates.

This way, in the fourth embodiment, the loop gain can be changed. Therefore, as in the first embodiment, a trade-off relationship between stable oscillation of the piezoelectric actuator drive circuit at a primary resonant frequency and an increase in the oscillation amount of the piezoelectric actuator 20 can be eliminated by adding a small number of circuits. In addition, unlike the first embodiment, it is not necessary to increase the number of inverters. Therefore, an increase in costs during integration can be further suppressed.

Fifth Embodiment

Figure 8:
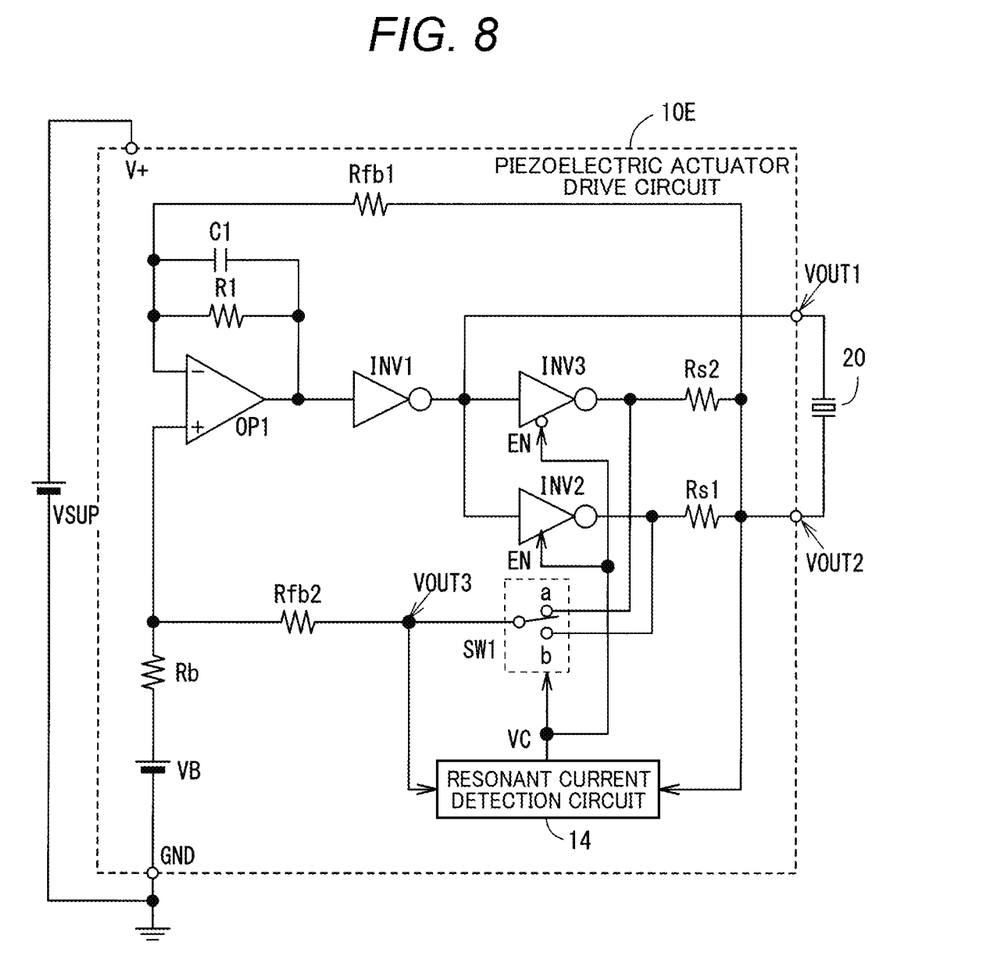
FIG. 8 is a circuit diagram illustrating a piezoelectric actuator drive circuit according to a fifth embodiment of the invention.

FIG. 8 illustrates a self-oscillating piezoelectric actuator drive circuit 10E according to a fifth embodiment. In this embodiment, by using a resonant current detection circuit 14 instead of the counter 11, the same switching of the switch SW1 as described above in the first embodiment and the same switching of the inverters INV2 and INV3 between the operation and the non-operation as described above in the first embodiment are performed. The resonant current detection circuit 14 compares voltages of both terminals of the sense resistor Rs2, that is, a voltage VOUT2 of one terminal of the piezoelectric actuator 20 and a feedback voltage VOUT3 of a common connection point of the inverter INV3 and the sense resistor Rs2 to each other to determine whether or not the value of the resonant current reaches a predetermined value.

Figure 9:
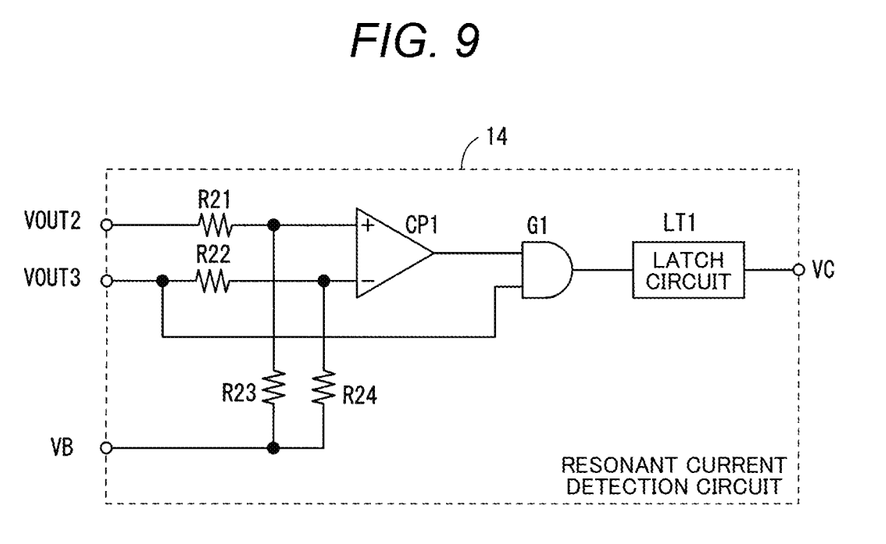
FIG. 9 is a specific circuit diagram illustrating a resonant current detection circuit of the piezoelectric actuator drive circuit illustrated in FIG. 8.
Figure 10:
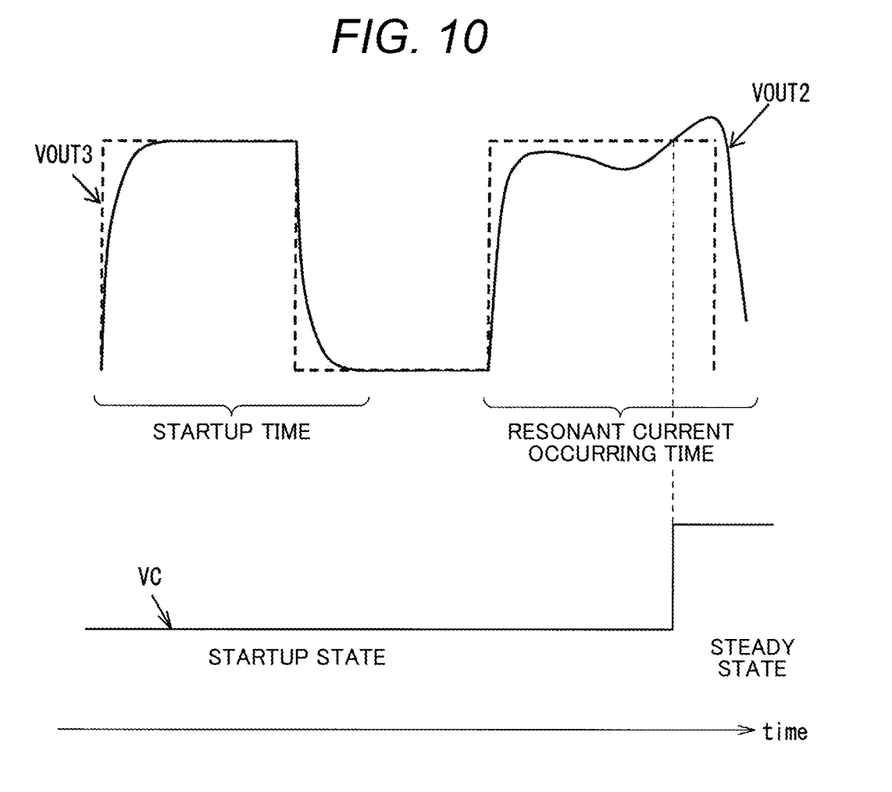
FIG. 10 is a waveform chart illustrating a voltage VOUT2, a voltage VOUT3, and a control signal VC of the piezoelectric actuator drive circuit illustrated in FIG. 8.

FIG. 9 illustrates a specific circuit of the resonant current detection circuit 14. The resonant current detection circuit 14 includes resistors R21 to R24, a comparator CP1, a gate circuit G1, and a latch circuit LT1. Immediately after activation, the voltage VOUT2 changes depending on a transient response derived from a time constant that is determined based on the capacity of the piezoelectric actuator 20 and the value of the sense resistor Rs2. Next, in a case where the primary resonant current slowly increases, the amplitude of the voltage VOUT2 is higher than that of the voltage VOUT3, and a relationship of the following Expression (1) is established. As a result, the output of the comparator CP1 becomes "H", the output of the gate circuit G1 becomes "H", and the control signal VC output from the latch circuit LT1 becomes "H".

$$|VOUT2 - VB| \times \frac{R21}{R21 + R23} > |VOUT3 - VB| \times \frac{R22}{R22 + R24} \quad (1)$$

Thus, the switch SW1 is switched to the contact point b, the inverter INV3 does not operate, and the inverter INV2 operates such that the sense resistor Rs1 having a low resistance value is connected to the negative feedback loop.

This way, also in the fifth embodiment, a trade-off relationship between stable oscillation of the piezoelectric actuator drive circuit at a primary resonant frequency and an increase in the oscillation amount of the piezoelectric actuator 20 can be eliminated by adding a small number of circuits, and an increase in costs during integration can be suppressed.

OTHER EMBODIMENTS

In the fifth embodiment described in FIG. 8, the same operations as those of the second embodiment illustrated in FIG. 5 in which the sense resistor Rs3 and the switch SW2 are used, the third embodiment illustrated in FIG. 6 in which the MOS transistor 13 and the drive circuit 12 are used, and the fourth embodiment illustrated in FIG. 7 in which the resistor R2 and the switch SW3 are used can be realized by using the resonant current detection circuit 14 that determines whether or not the value of the resonant current reaches a predetermined value instead of the counter 11.

In addition, in the description of the first embodiment illustrated in FIG. 1 and the fifth embodiment illustrated in FIG. 8, the control signal VC becomes "L" in the startup state and becomes "H" in the operating state. However, in a case where the control signal VC becomes "H" in the startup state and becomes "L" in the operating state, the same operations as those of the first and fifth embodiments can be realized by switching the switch SW1 to the contact point "a" in a case where the control signal VC becomes "H" and switching the switch SW1 to the contact point "b" in a case where the control signal VC becomes "L".

Hereinabove, various embodiments have been described with reference to the drawings. However, it is needless to say that the present invention is not limited to the embodiments. It is obvious to those skilled in the art that various modification examples and alternation examples can be conceived within the scope of the claims, and it should be noted that the examples are included in the technical scope of the present invention. In addition, various components in the embodiments may be appropriately combined within a range not departing from the scope of the present invention.

The present application is based on Japanese Patent Application No. 2015-207677 filed on Oct. 22, 2015, the contents thereof are incorporated herein by reference.

REFERENCE SIGNS LIST 10A, 10B, 10C, 10D, 10E, 10F: piezoelectric actuator drive circuit
11: counter
12: drive circuit
13: MOS transistor
14: resonant current detection circuit
20: piezoelectric actuator

The invention claimed is:
1. A self-oscillating piezoelectric actuator drive circuit comprising:
an operational amplifier;
an integrating circuit integrating a signal in which a negative feedback signal is subtracted from a positive feedback signal;
a first inverter inverting an output signal of the integrating circuit;
a second inverter inverting an output signal of the first inverter;
a sense resistor connected to an output side of the second inverter;
a positive feedback resistor disposed between an output signal of the second inverter and a positive terminal of the operational amplifier;
a negative feedback resistor disposed between an output signal of the second inverter and a negative terminal of the operational amplifier; and
a switching device switching frequency characteristics of the positive feedback signal and the negative feedback signal,
wherein a piezoelectric actuator is connected between a common connection point of the first inverter and the second inverter and a common connection point of the sense resistor and the negative feedback resistor, and
wherein the switching device switches the frequency characteristics of the positive feedback signal and the negative feedback signal between a startup state and in an operating state after the startup state.

2. The piezoelectric actuator drive circuit according to claim 1,
 wherein the sense resistor includes at least a first resistor and a second resistor having a higher resistance value than a resistance value of the first resistor, and the switching device switches to the second resistor in the startup state and switches to the first resistor in the operating state.

3. The piezoelectric actuator drive circuit according to claim 1,
 wherein the integrating circuit includes a feedback resistor, and
 the switching device switches a resistance value of the feedback resistor.

4. The piezoelectric actuator drive circuit according to claim 1,
 wherein switching from the startup state to the operating state is judged based on a pulse number of an output voltage of the first inverter.

5. The piezoelectric actuator drive circuit according to claim 1,
 wherein switching from the startup state to the operating state is judged based on a value of a resonant current flowing through the sense resistor.

\* \* \* \* \*